US007012738B1

(12) United States Patent
Schwarte

(10) Patent No.: US 7,012,738 B1
(45) Date of Patent: Mar. 14, 2006

(54) METHOD AND DEVICE FOR DETECTING AND PROCESSING SIGNAL WAVES

(76) Inventor: Rudolf Schwarte, Kreuztaler Strasse 56, 57250 Netphen (DE)

(*) Notice: Subject to any disclaimer, the term of this patent is extended or adjusted under 35 U.S.C. 154(b) by 0 days.

(21) Appl. No.: 10/399,452

(22) PCT Filed: Oct. 16, 2000

(86) PCT No.: PCT/DE00/03632

§ 371 (c)(1),
(2), (4) Date: Apr. 14, 2003

(87) PCT Pub. No.: WO02/33817

PCT Pub. Date: Apr. 25, 2002

(51) Int. Cl.
*G01J 9/00* (2006.01)
*G02F 2/00* (2006.01)

(52) U.S. Cl. .................. 359/325; 356/337; 356/433; 356/925; 359/326

(58) Field of Classification Search ........ 385/325–332; 73/61.71, 865.5, 432.1; 359/325, 326; 356/335–343, 356/432–436, 925
See application file for complete search history.

(56) References Cited

U.S. PATENT DOCUMENTS

| 4,015,464 A | * | 4/1977 | Miller et al. | ............... 73/61.75 |
| 6,476,957 B1 | * | 11/2002 | Ward et al. | ............... 359/326 |
| 6,643,417 B1 | * | 11/2003 | Strutz et al. | ............... 385/1 |

FOREIGN PATENT DOCUMENTS

| JP | 62-18855 | * | 1/1987 |
| JP | 3-35606 | * | 2/1991 |

OTHER PUBLICATIONS

Schwarte et al, "A New Electrooptical Mixing And Correlating Sensor: Facilities And Applications Of The Photonic Mixer Device (PMD)", Proceedings of the SPIE, vol. 3100, Jan. 1, 1997, pp. 245-253.*

Chao et al, "Photonic Mixers And Image-Rejection Mixers For Optical SCM Systems", IEEE Transactions on Microwave Theory and Techniques, vol. 45, No. 8, Aug. 1997, pp. 1478-1480.*

* cited by examiner

*Primary Examiner*—John D. Lee
(74) *Attorney, Agent, or Firm*—Paul & Paul

(57) ABSTRACT

The invention relates to a method for detecting and processing the amplitude and phase of signal waves. A Modulated signal source generates the signal waves which are modified by transmission medium or by reflection and scattering by at least one object. The modified signal waves are received and demodulated using a modulation signal. The amplitude of the modulated signal waves and their phase relationship to the modulation signal are measured and evaluated. The demodulated signal wave is converted into an electrical charge or charge displacement in the receiving medium and is distributed in accordance with a modulation signal to at least two readout outputs and fed to an evaluation unit. The evaluation unit produces the sum and difference of the output signals thus applying the value of the intensity and the phase position of the signal wave that has been scattered, reflected or delayed by the object.

15 Claims, 13 Drawing Sheets

METHOD AND DEVICE FOR DETECTING AND PROCESSING SIGNAL WAVES

FIELD OF THE INVENTION

The present invention relates to a method for detecting and processing the amplitude and phase of signal waves, in particular of electromagnetic waves in the total range of microwaves from heat radiation to gamma radiation (X-rays), furthermore of acoustic waves or ultrasonic waves and also of other current, voltage or charge-generating radiation signals, hereafter shortened to "signal waves" and, depending on the respective application, also acoustic, optic, electromagnetic signal waves, X-ray waves or microwaves, according to the precharacterizing clause of claim 1, and also devices for carrying out the process.

BACKGROUND OF THE INVENTION

An important technical task in industrial production and automation, in metrology, in road traffic, in safety engineering, environmental technology and many additional fields, consists of obtaining, via the propagation of signal waves, i.e. contact-less by means of wave propagation either passively (externally-generated signal waves) or actively (self-generated signal waves), information about the signal waves themselves and in particular about their sources or about objects which have modified the waves by reflection or transmission, in particular in the phase and amplitude. Measuring systems for such tasks have long been known, in particular laser radars for optical signal waves, microwave radars for microwaves, ultrasonic sonars for sonic waves and computer tomographs for X-rays. The preferably self-generated signal waves of a signal source are preferably modulated in suitable manner. If this modulation of a "carrier signal" is modified in phase and amplitude by the preferably multi-dimensional objects to be measured, object information can be obtained by suitable demodulation of the transmitted and reflected signal waves, e.g. the shape of a three-dimensional object by multipoint/multipixel measurement. The associated receiving apparatus is very expensive and generally only contains one receiver. However in order to measure many measuring points on the signal wave, it uses a scanner. The state of the art for optical signal waves is described e.g. on page 463 ff in "Handbook of Computer Vision and Applications", Volume 1, Sensors and Imaging, edited by Jähne et al, Academic Press. There, a novel solution for simplification of the optical receiver is described, the "photonic mixer device" (PMD), which is described for the first time in DE 196 35 932.5.

The photocharges generated in the PMD by the incident modulated light wave are, according to the state of the art, exposed to a demodulating oscillation process by means of at least two photogates and read out and evaluated in the push-pull, reducing the expenditure on, and size of the receiver by orders of magnitude, which makes possible the construction of an array producing images from many pixel-type receivers. In spite of this exceptional progress, such PMD pixel receivers have disadvantages: The modulating photogates cause an attenuation of the incident light. Moreover, the modulating electrical drift field is not optimally introduced into the flow direction of the photocharge. The modulation bandwidth of the modulation of the photocurrent distribution by means of this modulation photogate is practically limited to approximately 1 GHz. Furthermore, an essential sensitivity increase by corresponding design of these known CMOS modulation photogate PMDs using a charge carrier multiplication by impact ionization (avalanche effect) or other secondary electron multiplication is scarcely realizable.

Novel solutions are needed for photonic mixer devices without modulation photogates with, in particular, higher modulation bandwidths and accuracy and higher sensitivity.

SUMMARY OF THE INVENTION

The object of this invention is to provide a process of the type mentioned at the outset, to propose novel advantageous PMD receiver principles for optical signal waves whilst avoiding photogates, and to propose corresponding devices for carrying out such a process and simultaneously to extend such a process to other signal waves such as microwaves, sonic waves and X-rays, and to propose corresponding devices for carrying out such a process.

Such a process is intended to enable the receiving apparatuses for the very different properties of the types of signal waves named to be simplified and reduced in size in targeted manner so that at low cost a plurality of receiving pixels can be operated in parallel, performance and functionality increased and e.g. a 3D image can be produced. The receiving apparatus is intended to be designed such that an amplification and processing of the carrier signal is decisively reduced and the performance features such as measurement sensitivity, measurement accuracy etc. are increased.

BRIEF DESCRIPTION OF THE DRAWINGS

FIG. 10a illustrates a VAC-PMD for carrying out a process according to the present invention.

DETAILED DESCRIPTION OF THE PREFERRED EMBODIMENTS

The aforesaid object of the invention is achieved by the features of process claim 1, by specifying this process specifically for different signal waves, and by the subsequent device claims for carrying out the process. This invention is based on the knowledge that a common receiving process independent of the type of signal waves consists of a demodulating push-pull oscillation process and can be carried out advantageously on an industrial scale, and that for optical signal waves or photocharges generated by same in a modification of the known process, such an oscillation process is not dependent on the use of photogates in the CMOS and CCD photogate PMDs, and that for different optical problem definitions, novel, very advantageous alternative PMD processes and corresponding PMD realizations can be named, and that this demodulating push-pull oscillation process can be used on very different types of signal waves such as microwaves and ultrasonic waves and X-rays, and that corresponding devices for carrying out this process in principle for all types of signal waves can be named.

Therefore a basic process according to the invention is proposed which can be used on all types of signal waves and which allows an essential simplification of the measuring process for detecting and processing the phase and amplitude of signal waves, as detection and mixing are combined and integrated in a novel component, an inherently mixing receiving pixel.

Novel and advantageous are in particular the detection-inherent mixing and demodulation procedures according to the invention of the modulated signal wave or the corresponding converted signal wave or the rectified modulation wave using a demodulated push-pull oscillation process with a modulation signal which is suitably related to the modulation of the signal wave.

Figure 1:
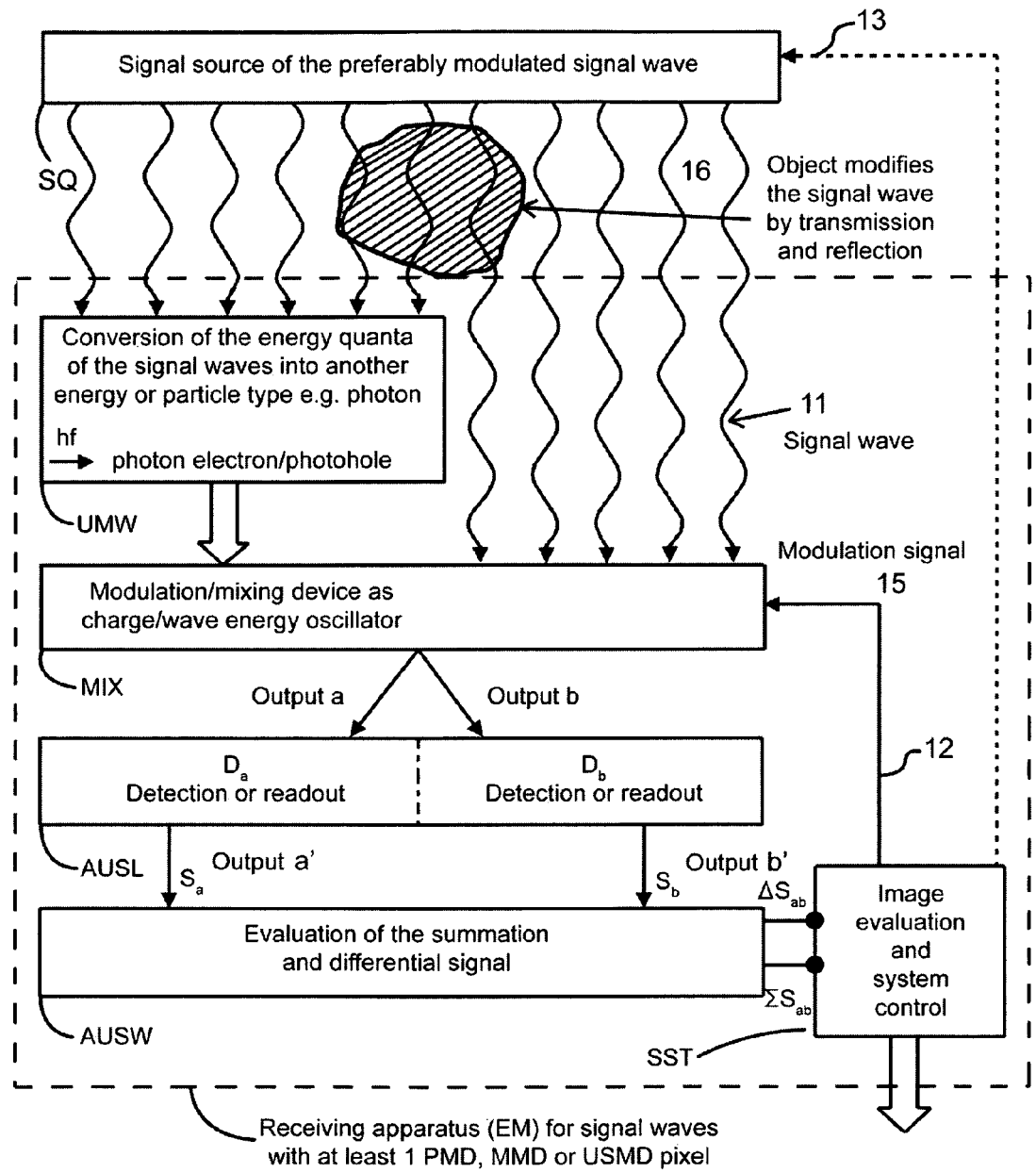
FIG. 1 illustrates the basic principle of the direct push-pull mixing of the signal wave or the particles derived from the signal wave in the converter (UMW) on at least two outputs with the associated readout and evaluation of the differentials, sums and quantities for 3D image evaluation.

With the process according to the invention in which the receiving principle of the phase and amplitude measurement of the modulated signal wave can be essentially simplified and improved, a modulated signal wave is transmitted by a signal source (SQ in FIG. 1).

Before the signal wave 11 reaches a receiving apparatus EM with at least one receiving pixel for optical or acoustic or microwave or X-ray signal waves, it passes through a suitable propagation medium and is modified in space preferably by transmission or reflection through objects 16 to be examined. The signal wave reaches the receiving device EM preferably after suitable imaging either via a signal converter UMW which converts the signal wave into another type of particle, or directly onto a charge or particle or wave energy oscillator MIX active as modulation/mixing device. The modulation of the signal source SQ is controlled by the system control (SST) with active illumination or irradiation or acoustic irradiation via the wire 13, as is preferably similarly the modulation/mixing of the mixing device (MIX) via the wire 12. In certain applications, the modulation signal can also be externally determined or unknown. Then the modulation of the signal wave is determined e.g. by scanning the modulation frequency or the coding in the mixing device (MIX) and its amplitudes and phases evaluated in the form of pixels.

The modulation/mixing device effects a push—push mixing/demodulation of the signal wave by means of the modulation signal via an at least twice direction-modulating wave-energy oscillator (for e.g. photons or phonons) or energy-quantum oscillator (for e.g. photoelectrons). The thus obtained energy quanta or charges represent the desired mixed products and are fed via the at least two push-pull outputs a and b to the two readout units Da and Db of the readout apparatus AUSL.

The detection and or readout unit (AUSL) with the separated outputs a' and b' preferably averages the signal amplitudes e.g. by current rectification/current readout and passes the associated output signals $s_a$ and $s_b$ to the evaluation unit (AUSW). According to the evaluation aim, these mixed signals are here subjected, e.g. for a 3D image evaluation, to a short-time integration or short-time correlation. Furthermore, preferably in the evaluation unit, the differential $\Delta Sab$, which as a rule represents the autocorrelation function, and the sum $\Sigma Sab$, which represents the signal wave amplitude, are formed and passed onto the image evaluation and system control SST. Non-correlated mixed products at the outputs a and b are the same size, for reason of symmetry, and according to the invention are either e.g. capacitively suppressed as a direct proportion by the type of oscillation process, or they are preferably regulated by an additional overlaid compensating direct proportion. Thus the measurement dynamics of the process according to the invention are improved by orders of magnitude. The system control and preferably image evaluation (SST) in multipixel systems yields the sought application-specific data, e.g. a 3D image sequence, and simultaneously controls the system.

Independent of the type of signal wave considered, in such a receiving apparatus according to the invention or in a complete measuring system with transmitting and receiving apparatus, the detection and processing are carried out according to the basic common process of claim 1. Signal-dependent differences follow from a specification of the individual process steps and in particular in the industrial execution of the process.

The specification of the process steps for optical or acoustic or microwaves or X-ray signal waves and examples for the corresponding execution of this process according to the invention are described hereafter. Because of the different detection principle, the electromagnetic waves are distinguished according to microwaves (without photoeffect) and optical waves (with photoeffect as of approx. 15 THz).

1. Specification of the process according to the invention and examples of its execution for ultrasonic mix detection and ultrasonic mixer device USMD:

1.1 For acoustic or ultrasonic signal waves, a modulation signal 15, preferably a push-pull modulation signal, determines with the help of a suitable modulation device as push-pull phonon oscillator MIX, when and to what extent the incident signal wave or its signal energy in the form of phonons is allocated preferably to one or other of at least two detectors Da and Db of the detection and readout device and preferably a plurality of detectors which form at least two detector groups. These detector groups can be developed e.g. as two groups each of 2, 4 or 8 lines of capacitor microphones preferably in air, or piezo detectors in air or liquid. The ultrasonic signal wave 11 is preferably composed of an amplitude-modulated high-frequency carrier. It is preferably firstly converted by a converter UMW into an electric signal and demodulated, preferably with elimination of the carrier signal, and subsequently supplied to the mixing device MIX and, as described in the basic process, read out and evaluated. The mixing can take place according to the invention also in a purely acoustic mixing device MIX directly in the acoustic range. The energy oscillation (MIX) and the corresponding allocation of the signal wave energy concentrated in the middle between the detector lines is preferably effected on one or other of the ultrasonic detector lines Da or Db with low acoustic or mechanical transverse influences and forces by an acoustic modulation signal 15. The influence of the modulation signal is preferably exerted via an acoustic or ultrasonic excitation perpendicular to the incidence direction of the signal wave in a suitable acoustic construction, e.g. using piezo elements. By differential formation of the at least two detector or readout signals $s_a$ and $s_b$ in the evaluation unit (AUSW), the pixel phase between the incident signal wave and the modulation phase is determined. By summation, the pixel amplitude of the relevant signal wave of such a USMD pixel is determined. The definition of such ultrasonic mixer devices as USMD pixels and their use in ultrasonic lines and matrix cameras opens up completely new possibilities in ultrasonic metrology and ultrasonic image production, in particular irradiation-selective, three-dimensional measurement. The processes of microscopy, e.g. LIGA processes, can be used for industrial realization.

2. Specification of the process according to the invention and examples for its execution for microwave mix detection and the microwave mixer device MMD:

2.1 The signal source SQ transmits preferably very shortwave electromagnetic signal waves of the carrier frequency $f_T$ in the microwave range, which are preferably amplitude-modulated via the wire 13. A modulation signal via the wire 12, preferably a push-pull modulation signal, determines by means of the modulation device or energy oscillator (MIX), when and to what extent the incident signal wave or its signal energy in the form of phonons or voltages generated by the signal wave via suitable antennae, or currents which are preferably rectified in the push-pull mixing device, is allocated modulation-dependent to one or other of at least two detectors $D_a$ and $D_b$ with associated outputs.

3. In particular for optical signal waves, novel and relatively different process specifications and devices for carrying out the process according to the invention with very advantageous features whilst avoiding the disadvantages of photogates are proposed:

1. Metallic modulation electrodes with or without self-modulation of the readout electrodes: ME/SM-PMD based on PIN photodiode technology, 2. Metal-semiconductor-metal MSM-PMD based on Schottky photodiodes, 3. APD-PMD based on avalanche photodiode technology, 4. On vacuum-tube basis, a novel "VAC-PMD" and in particular on image-amplification-tube basis a "MCP-PMD" with additional microchannel-plate amplification is proposed, 5. AOM-PMD based on a wave-energy oscillator with acousto-optical modulator, 6. Piezo-PMD based on Piezo voltage or Piezo field strength incorporated into the oscillation process via an ultrasonic wave, 7. Microreflector-PMD based on angle-modulated microreflector arrays preferably for the receiver side and the transmission side in the process according to the invention, 8. Time-resolved PMD spectroscopy with additional spectral measurement and allocation of relaxation times of quanta transfers, 9. X-ray PMD with modulated X-radiation and evaluation in particular of the secondary radiation in the measurement objects, 10. 2D-PMD/USMD/MMD camera for the highest 2D sensitivity and spectral resolution in the case of low modulation frequencies.

3.1 ME/SM-PMD

In a first specification of the process for optical signal waves, a novel and advantageous, inherently mixing optical receiving pixel or PMD pixel, known as photonic mixer device (PMD), is proposed which has no modulation photogate.

The photonic mixer devices known to date have modulation photogates which attenuate the incident light. The direction of the thus-incorporated drift field corresponds to a limited degree only to the desired direction of transport of the photocharges. Proposed are modulation electrodes which shield the readout electrodes by covering them and can be made of metal and hinder photocharges in undesired ranges and simultaneously produce a more effective drift field in photosensitive modulation volumes.

Figure 2:
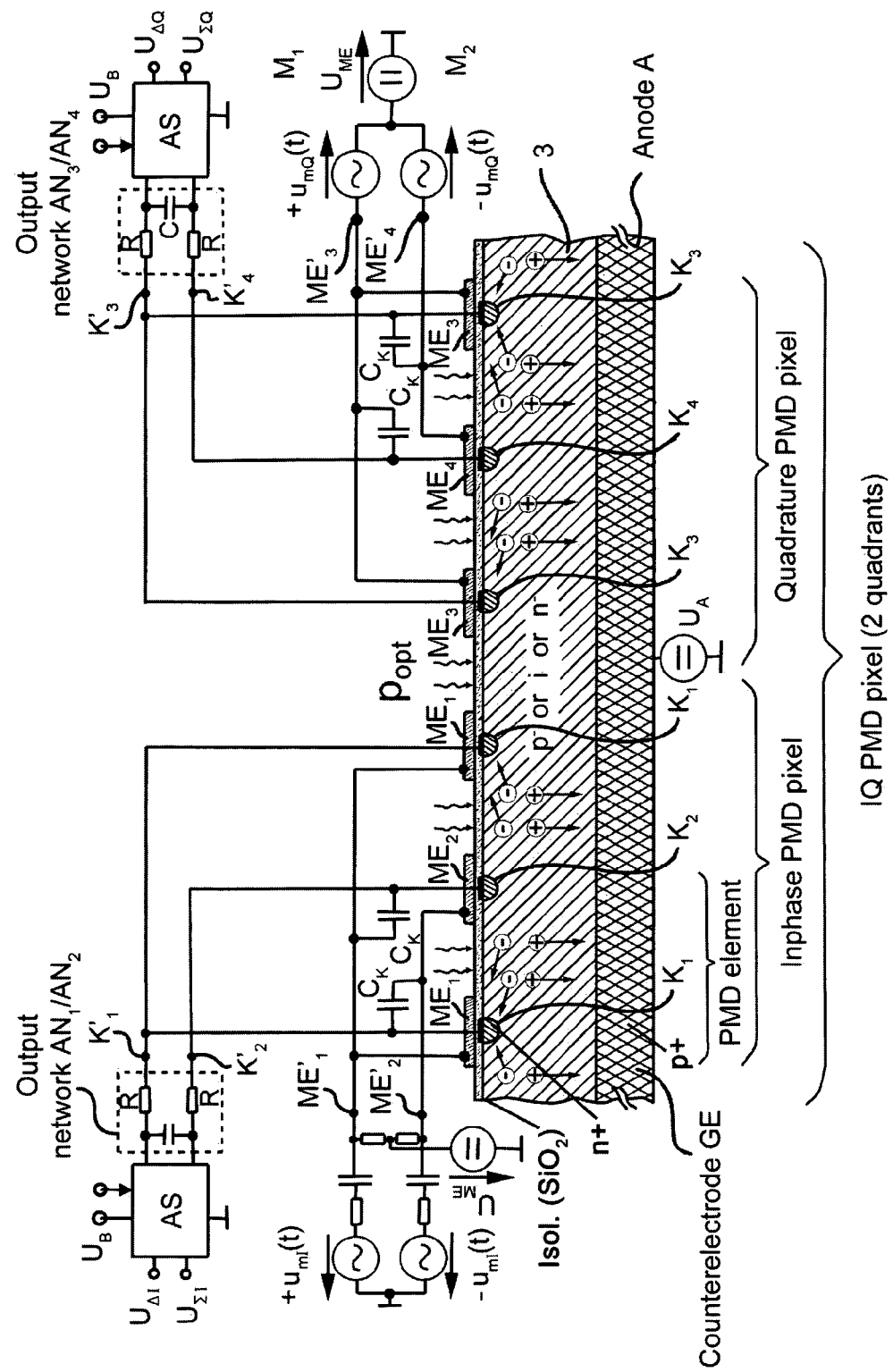
FIG. 2 illustrates a section through a part of a planar photonic mixer device according to the invention with cathode readout of the photoelectrons, with modulation electrodes ME as shield for the readout diodes, with a 2-phase mix (0, 90° or I/Q) and with general minimum wiring.

FIG. 2 shows the semiconductor photodiode structure of the ME/SM-PMD in the cross-section in the double version for the parallel inphase and quadrature phase measurement. The push-pull modulation generators can modulate only the modulation electrodes $ME_1$, or $ME_2$ or simultaneously the readout cathodes ($K_1$, $K_2$) via $C_k$, as required.

Figure 3:
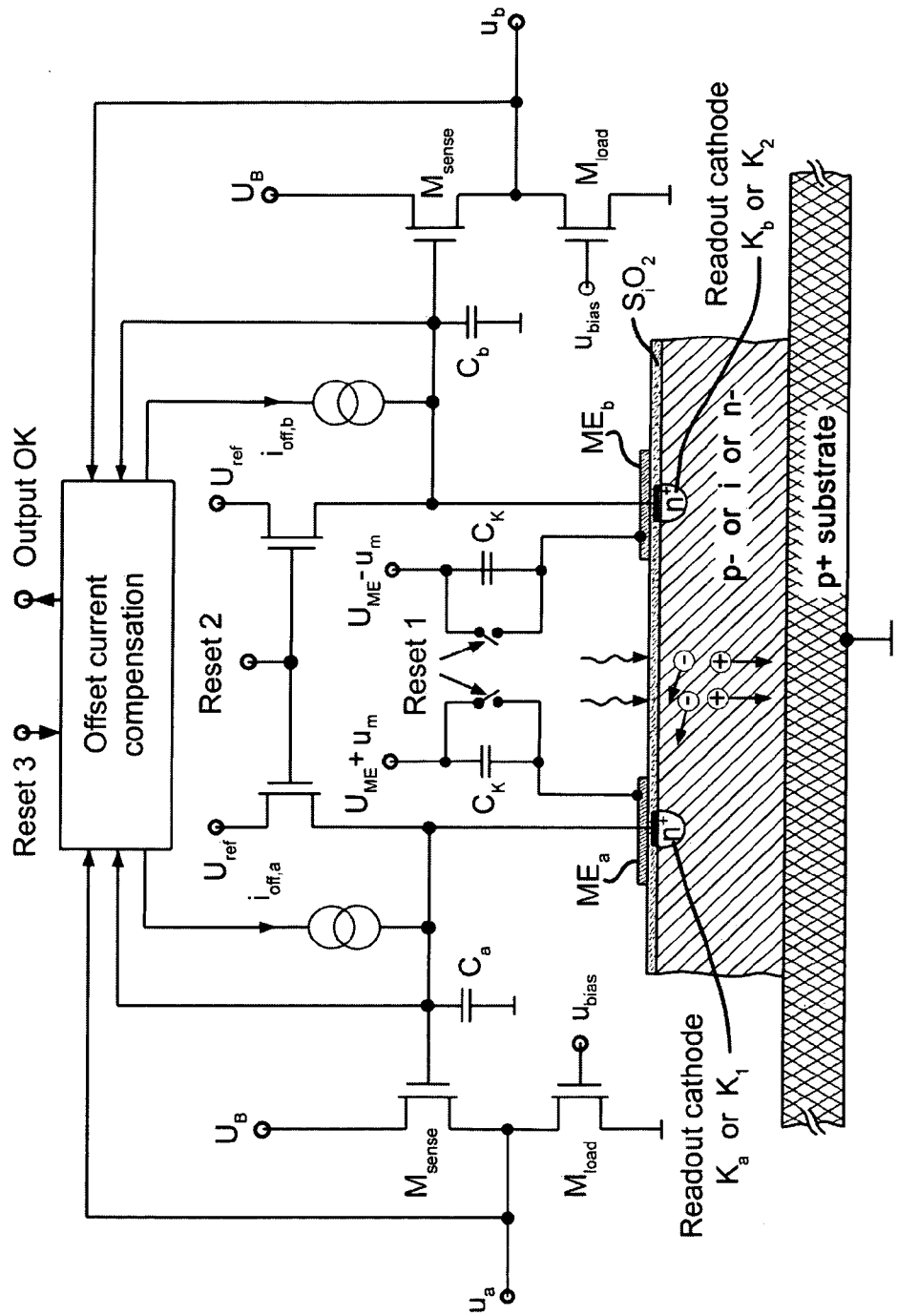
FIG. 3 illustrates a section through a part of a planar photonic mixer device according to the invention according to FIG. 2 with an exemplary version of the readout circuit and an additional regulated compensation of uncorrelated symmetrical photocurrents.

FIG. 3 shows a cross-section of a part of an ME-PMD without self-modulation, i.e. just indirect self-modulation, and with a version of the offset or background light current compensation. By measuring the readout-cathode voltages, the symmetrical offset currents $i_{off,a}$ and $i_{off,b}$ can be regulated such that the linear control range of the readout circuit is not departed from.

The present invention also relates through the particular property of self-modulation as a result of the readout electrodes in the optical range to MSM-PMD, AOM-PMD and VAC-PMD and thus all semiconductor photodiode structures (FIGS. 2–7) and vacuum photodiode structures (FIGS. 10, 11) composed of at least two photodiodes and preferably a plurality of photodiodes, which have an anode ($A_1$, $A_2$) each and a preferably common cathode (K) and in the case of the semiconductor photodiode structure alternatively a cathode ($K_1$, $K_2$) each and a preferably common anode (A), the anode and cathode ranges of the semiconductor photodiode structure each being defined by suitably doped ranges in or in connection with a photosensitive semiconductor material (3), and in the case of the vacuum photodiode structure, the cathode being defined by a light-sensitive or radiation-sensitive photocathode (K) and the at least two anodes (A1, A2) by positively biased electrodes in the common vacuum vessel (191), and the anodes and cathodes each having electric terminals ($A'_{1,2}$ or K'), and in direct proximity of the at least two anodes or the at least two cathodes, a modulation volume being defined by suitable bias voltages in the space charge zone with the semiconductor photodiode structure or in vacuum with the vacuum diode structure, in which photocharges are prepared through the irradiated light signals via the internal or external photoeffect, and preferably at least two modulation electrodes ($ME_1$, $ME_2$), allocated to the at least two anodes or cathodes in each case, with the electric terminals ($ME'_{1,2}$) in each case likewise being arranged in direct proximity of the modulation volume having the photocharge.

The at least two modulation electrodes ($ME_1$, $ME_2$) are not developed as modulation photogates but rather such that they do not impair the incident light, and such that this semiconductor photodiode structure and also this vacuum diode structure can be operated as photonic mixer device in that the photocharge in the modulation volume is exposed to a modulated electric drift field which, according to its polarity and intensity, allows them to drift mainly to one of the at least two electrodes acting as readout electrodes (A1 or A2 or K1 or K2) in each case, the modulation drift field being able to be produced in various ways, preferably a) by sole modulation of the at least two anodes or cathodes in each case preferably with a push-pull modulation voltage ($\pm u_m$), which are overlaid on its bias voltages and signal voltages which are small to detect, because of the photocharges or photocurrents, in the simplest case no modulation electrodes being provided, as in particular with MSM-PMD, or the at least two modulation electrodes ($ME_1$, $ME_2$) supporting not the modulation field, but rather the static electric fields e.g. to suppress a parasitic transistor effect, and a very low doping of the space charge zone being advantageous, or preferably b) by sole modulation of the at least two modulation electrodes ($ME_1$, $ME_2$) in each case with preferably a push-pull modulation voltage ($\pm u_m$), for high sensitivity the capacitive crosstalk onto the readout cathodes or readout anodes being compensated by a counter-phase inserted modulation signal of the same amplitude, and, as a support, a stationary acoustic wave being generated in a suitable piezo-electric semiconductor material, the electric field components of which support the modulation drift field, or preferably c) by simultaneous modulation, matched in amplitude and phase and bias voltage, of both the at least two readout electrodes (A1 and A2 or K1 and K2) in each case and the at least two associated modulation electrodes ($ME_1$, $ME_2$), the electric terminals being developed according to the modulation type, the electric terminals of the at least two readout electrodes (A'1 and A'2 or K'1 and K'2) being connected via associated, suitable readout networks (AN1,2) with an evaluation circuit (AS) and in the case of the modulation of the readout electrodes via suitable coupling networks (KN1,2) simultaneously with the modulation generator (MG), and the electric terminals of the at least two associated modulation electrodes (ME'1, ME'2) being connected with the modulation generator (MG) via suitable coupling networks (KN1,2).

3.2 MSM-PMD

Figures 4, 4A:
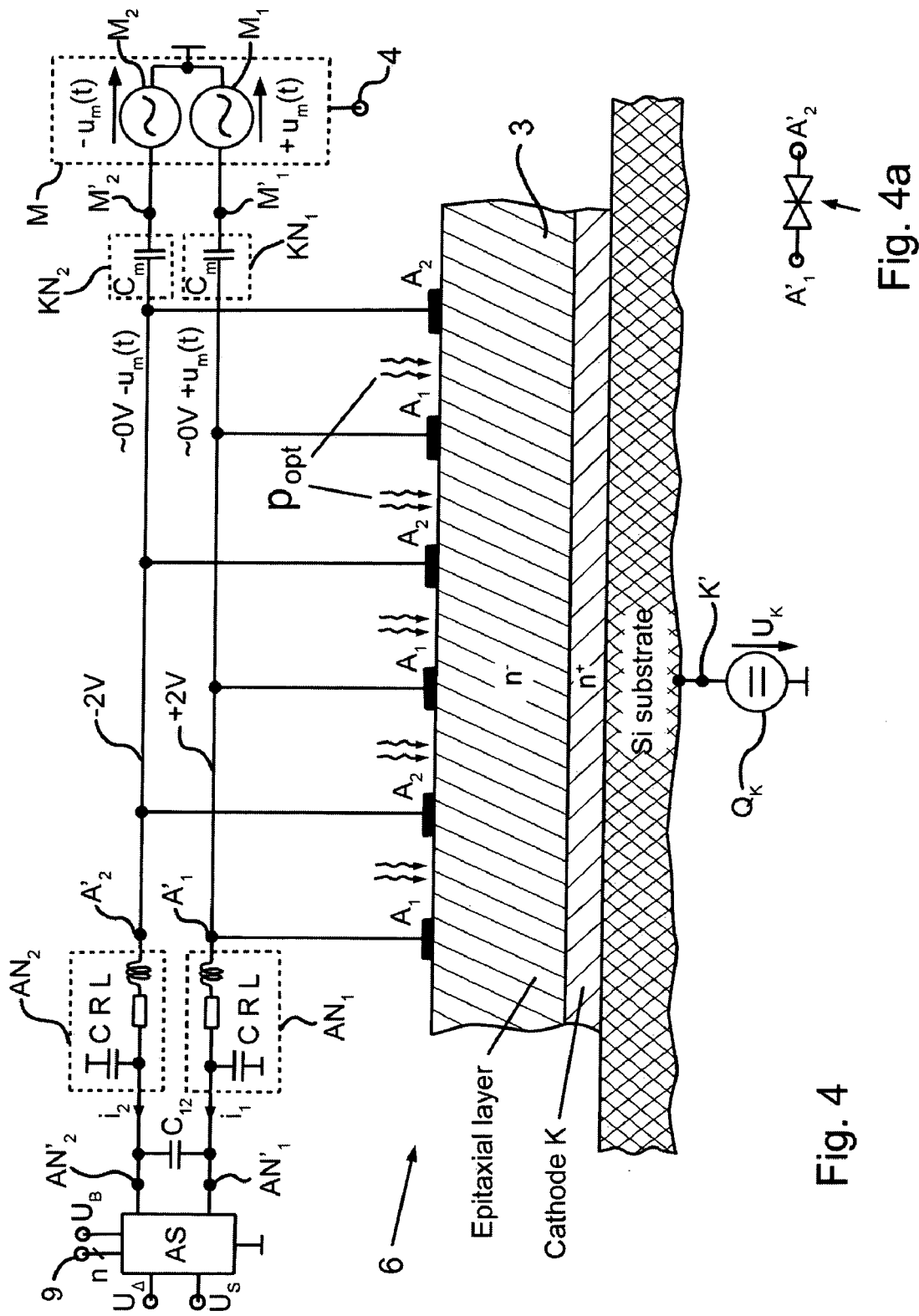
FIG. 4 illustrates a section through a part of a planar photonic mixer device according to the invention in Schottky-diode technology with anode modulation and readout and with an advantageous circuit for operating as correlator etc.
FIG. 4a illustrates the replacement image of the MSM Schottky diode structure with respect to the terminals A1' and A2'.
Figure 5:
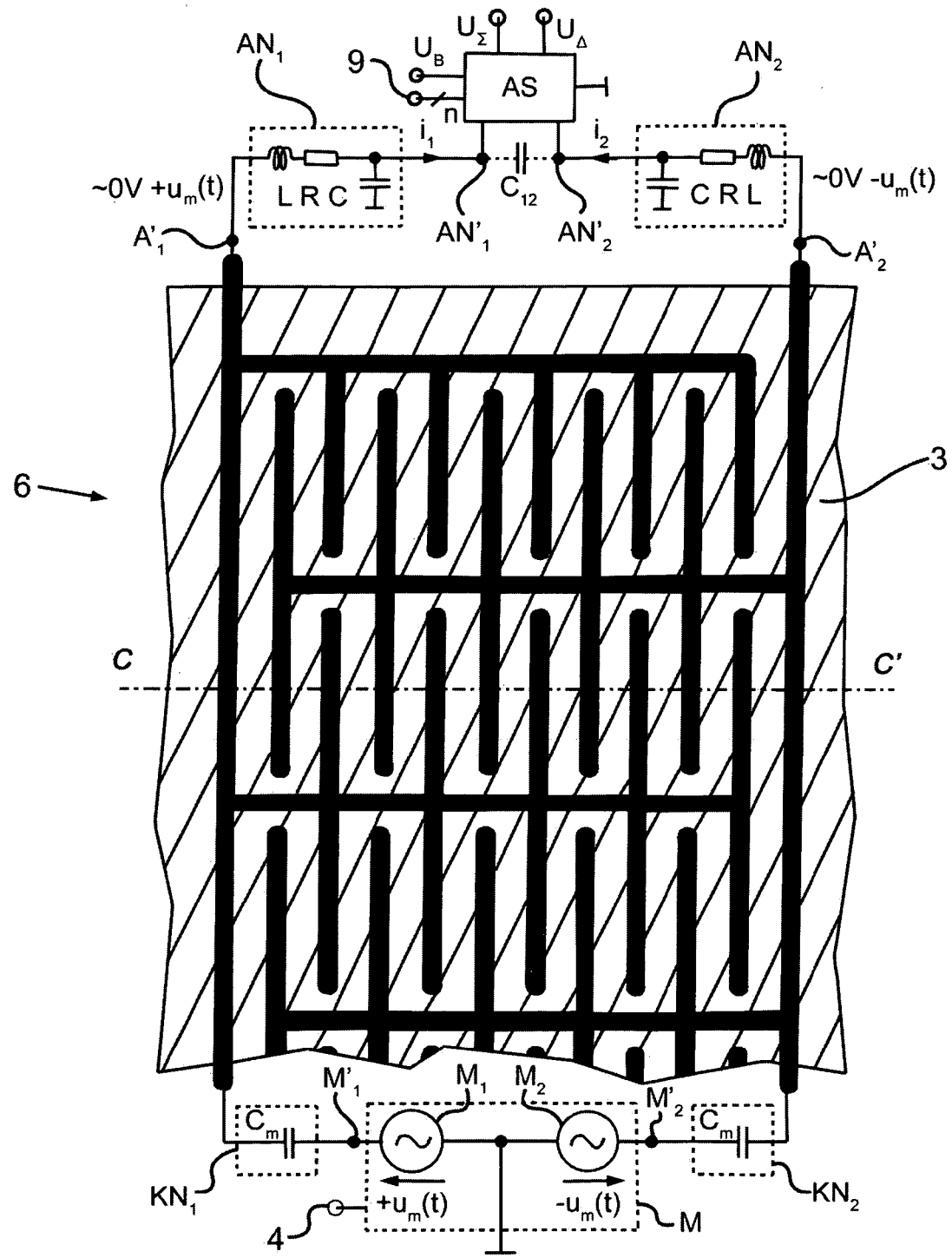
FIG. 5 illustrates the top view of the photonic mixer device according to FIG. 4 including an advantageous wiring for preferably correlator applications.

FIG. 4 shows an embodiment of an MSM-PMD in cross-section and FIG. 5 in top view. The metal strips on n-doped semiconductors represent Schottky transfers. Here there is pure self-modulation of the readout anodes. High modulation bandwidths in the GHz range enable the highest possible measurement accuracies of the times of flight (TOF).

3.3 APD-PMD

Figure 6:
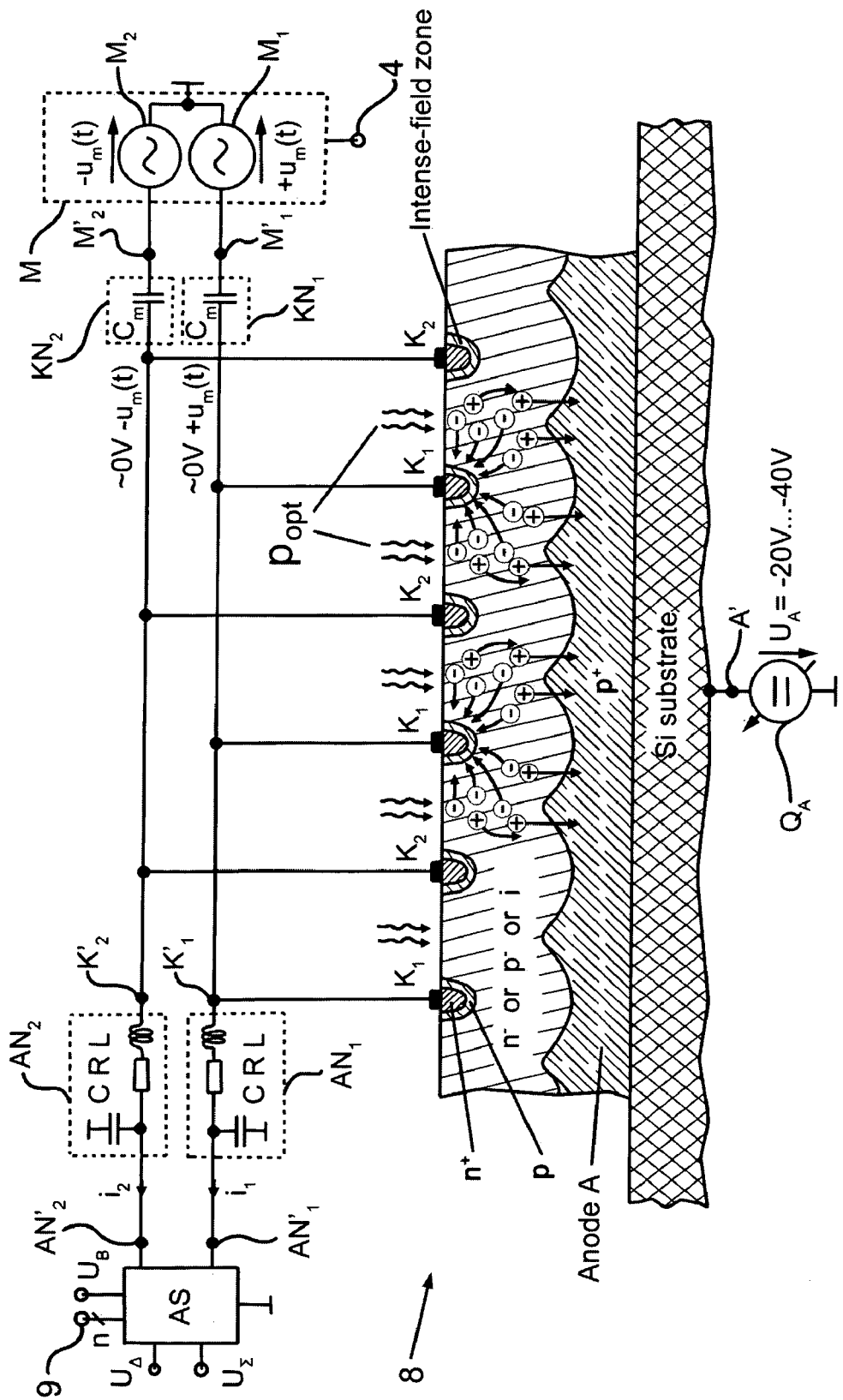
FIG. 6 illustrates a planar avalanche photonic mixer device, shown in cross-section of strip-form or hemispherical readout diodes with avalanche-effect intense-field zone.

FIG. 6 shows the cross-section of an APD-PMD. The readout cathodes are surrounded by a p-doping as intense-field zone and developed in strip-shape or in hemisphere shape in order to support the avalanche effect through a strongly inhomogeneous field. The bias voltage of the photodiodes is preferably increased in regulated manner up to the breakdown limit. Through the additional modulation voltage either at the readout cathodes or combined at the anode, the photocurrent is amplified in the timing of the modulation voltage, which is equivalent to the mixing of the charge oscillator.

3.4 VAC-PMD and MCP-PMD

Secondly, a vacuum photonic mixer device (Vac-PMD) is proposed for optical signal waves in which a photocathode is arranged upstream as converter of the photons into photoelectrons, and in which the modulation apparatus or charge oscillator is composed of modulated electrodes in vacuum which control the electron current.

a) By modulation preferably in push-pull of the anode voltage even of at least two preferably adjacent strip-form anodes, which controls the distribution of the electrons according to this modulation voltage.

b) By modulated lattices allocated to each anode, which distribute the electrons according to the modulation voltage onto the preferably unmodulated at least two anodes.

c) By modulation of the strip-form metallization of the end surfaces, facing the photocathodes as anodes, of a microchannel plate (MCP) with at least two strips which are preferably modulated in push-pull, the distribution of the electrons onto the microchannels multiplying the electrons is controlled. This 2D secondary electron multiplication takes place after the oscillation process or mixing process and does not impair the time resolution.

In the case of a larger number of pixels of this Vac- or MCP-PMD, an optical readout via a phosphor screen by means of CCD camera can hereby preferably take place instead of a current readout, in that the current of free electrons is projected onto a phosphor screen, where the corresponding differential and summation values $\Delta S_{ab}$ and $\Sigma S_{ab}$ of the current-equivalent signals are to be formed from the CCD charges.

For the arrangement of the anode strips in finger structure, structures similar to the known PMD finger structure apply.

Figure 10:
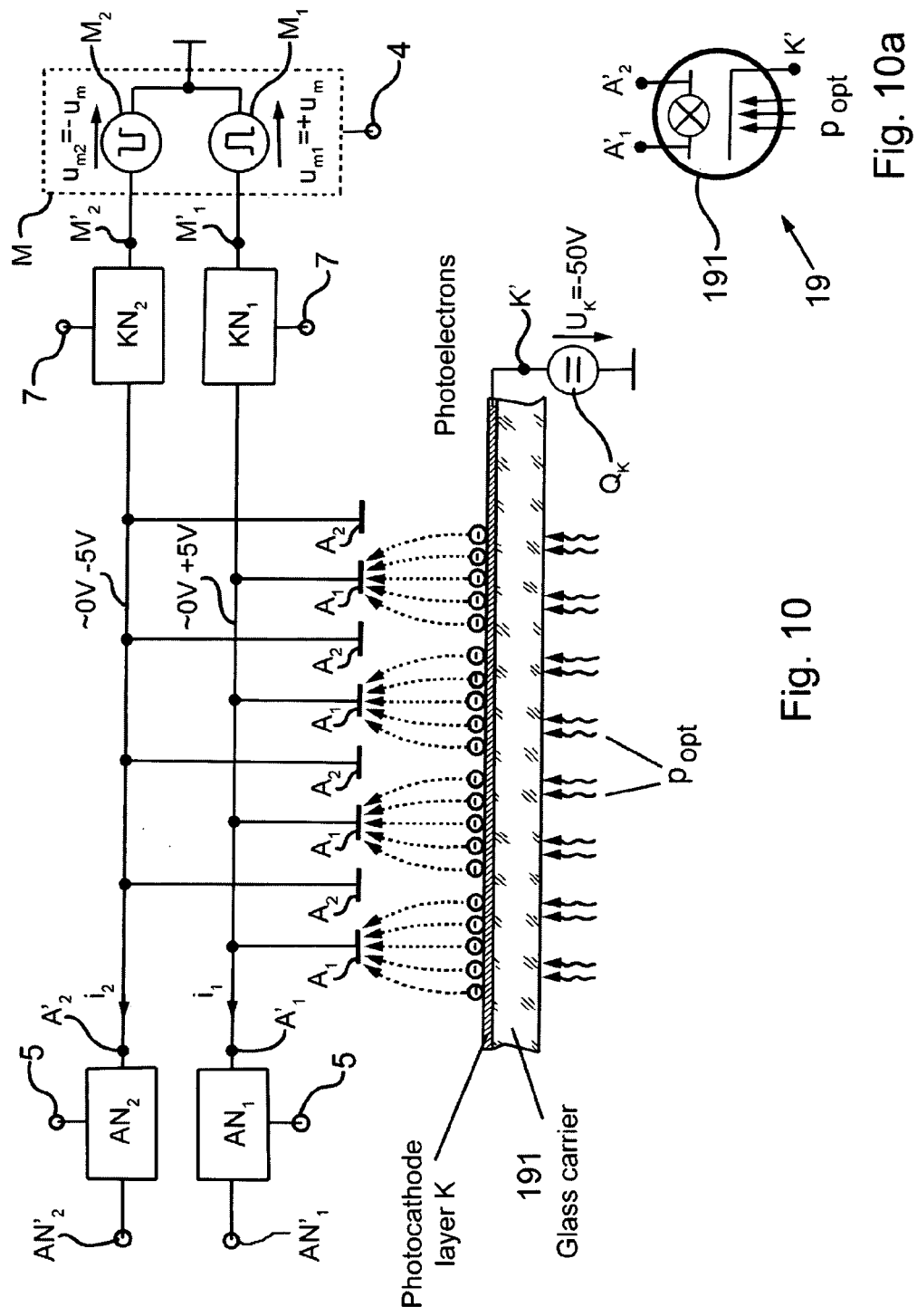
FIG. 10 illustrates a vacuum-PMD, lattice-like additional modulation electrodes ME are not shown.

The version, shown in FIG. 10, of a VAC-PMD (19) for carrying out the process according to the invention is of particular importance for many novel applications, up to approx. 2 $\mu$m of the boundary to the far-infrared, for the large spectral width of the photocathode (K), in particular also for energy-rich radiation quanta of various radiation types. The photoelectrons produced in vacuum by the light signal via the photocathode surface will travel approx. 0.1 to approx. 1 mm from the photocathode surface to the anodes $A_1$ and $A_2$ with some 10 to some 100 volts in a short flight time of some 10 to some 100 ps. After the direction modulation to one or other anode group, the mixing process is already concluded so that a bandwidth of over 10 GHz can be achieved. The evaluation possibilities of the mixed products with vacuum PMDs are in principle no different from those of semiconductor PMDs. The decisive difference and great advantage lies in the possibility of a downstream amplification by charge carrier multiplication, preferably by secondary electron multiplication by means of a microchannel plate (MCP) (201) which is composed of an approx. 0.5 to a few mm thick disk of approx. 100,000 glass tubes per $cm^2$ which are operated as high-amplifying readout channels of the photoelectrons. The end surface of the channel plate facing the photocathode is coated with conductive, preferably metallic, strips which represent the at least two anodes $A_1$ and $A_2$ which belong to at least two groups of anodes each with common terminal $A'_{1a}$ and $A'_{2a}$. The opposite end surface of the channel plate is preferably coated overall with metal and has a voltage suitable for the secondary electron multiplication between both end surfaces.

The readout of the amplified photoelectrons takes place either directly via a pairwise pixel structure, matched to the modulating anode strips, with charge readout, or via a phosphor layer and an optical readout in the form of pixels.

3.5 AOM-PMD

Thirdly, a device analogous to 2.1 for microwaves for carrying out the process is proposed for optical signal waves, in which an acousto-optical modulator (AOM) forms the modulation apparatus which projects alternately onto the focus lines of the thus-produced gradient lenses, e.g. through a stationary acoustic wave analogous to the modulation apparatus, given by way of example, of the receiving and evaluation apparatus for microwaves. In this case at least two correspondingly shaped photodiode strips Da and Db are arranged in the focus lines, which detect the signal energy proportions and read them out as charges. The remaining constellation of the receiving apparatus of such an AOM-PMD is unchanged and described many times.

3.6 Piezo-PMD

A modulation device is proposed for optical signal waves in which the electric modulating field of the charge oscillator between the at least two readout diodes of a semiconductor PMD structure is produced by a preferably stationary acoustic wave in a piezo-electric semiconductor material. The distance between the readout diodes corresponds to approx. half the wavelength of the acousto-optical modulation wave. In one embodiment, the modulation voltage excites the stationary wave via a piezo crystal, which in turn produces a corresponding electric drift field via the density fluctuations between the readout electrodes. The remaining constellation of the receiving apparatus of such a Piezo PMD in the finger structure remains unchanged and is described many times.

This effect can also be supported by electric modulation fields applied from the outside.

3.7 Microreflector-PMD

Fifthly, an array of microreflectors are proposed as wave-energy oscillator for electromagnetic waves preferably in the optical range, which are switched with the modulation signal, preferably electrostatically, up to the MHz range and which switch the incident signal wave to at least 2 detectors in each case. The differential between these detector signals represents the sought correlation function $\Delta S_{ab}$.

3.8 Time-Resolved PMD/USMD/MMD Spectroscopy

If the modulated optical signal source transmits light of a specific wavelength, only the reflectivity of the illuminated objects are illumination-selectively measured with respect to this wavelength. This property enables applications for spectroscopic examinations:

If the signal source is varied continuously or gradually over a broad wavelength range, the spectral reflectivity of the object is obtained as a point, line or matrix, depending on the wavelength.

Preferably for the optical range, a version according to the invention enables time-resolved spectral measurements with a novel time-resolving spectrometer. The reflection or transmission of an irradiated object can be resolved in the intensity over the wavelength with microspectrometers customary in the trade. A sample irradiated with UV light remits e.g. also in the longer wavelength range. This spectrum is imaged, e.g. via a concave lattice onto a photodiode line and measured. For example, specific spectral lines are obtained which identify the sample. The associated reflection times of these excited electron transfers are similarly of great interest. For this, the radiation source is modulated according to the invention and the photodiode line replaced by a PMD line according to the invention which is loaded with the corresponding modulation signal. Such a time-resolved microspectrometer enables swift and cost-favourable substance analyses and great improvements in time-resolved fluorescence spectroscopy.

3.9 X-ray PMD

In many measurement tasks, information is desired about the structure inside the 3D objects. MCP-PMD cameras are particularly suitable for an optical tomography with corresponding transparency of the objects. X-rays in the wavelength range from 0.02 nm to some 10 nm can almost always be used. A suitable signal source SQ for X-rays can be realized according to the invention e.g. in that the cathode ray current of an X-ray tube is modulated with the modulation signal e.g. via the intensity control. Thus the X-radiation is also intensity-modulated. X-ray detectors can be designed according to at least one of the proposed principles to realize the demodulating push-pull oscillation process, e.g. an MCP-PMD with suitable photocathode material or a CCD X-ray camera on cadmium-telluride basis. The particular advantage is in the additional precise measurement possibility of the signal wave durations, in particular also the secondary radiations released in the object.

3.10 2D PMD/USMD/MMD Camera

By using relatively low modulation frequencies of e.g. some 10 KHz to a few MHz, the receiving apparatuses (EM) equipped with the optical or ultrasonic or microwave mix detectors according to the invention can be operated to almost the maximum of the correlation function of the preferably same modulation of the signal source and the modulation signal. The duration effects are then negligible. The echo propagation time or phase evaluation is dispensed with and the corresponding modulation apparatuses (MIX) are constructed more simply and cheaply. The particular advantage is in the MW, US and light-irradiation selectivity on the basis of the correlation, as only the signal source delivers push-pull correlation results. For reasons of symmetry, the offset or direct-voltage or direct-current socket is suppressed at the two outputs of the energy/charge oscillator (MIX) e.g. by non-correlated background signal waves by means of a symmetrical, regulated offset current removal or from the outset by a capacitive charge oscillator such e.g. in the case of MSM (metal semiconductor metal) PMD. Only the quantities of the active irradiation $S_a$ and $S_b$ or only the intensity of the 2D image are evaluated.

Thus what is a big industrial problem in practice can be solved. MW, US and light scanners, reflex, MW, US and light barriers, barcode readers and in particular 2D PMD cameras, 2D MMD cameras and 2D USMD cameras according to the invention measure only the intrinsic active irradiation, whereas the passive background radiation, insofar as it does not correlate with the modulation signal used or with the coding used, is almost completely suppressed.

Many combinations of the versions of the process according to the invention shown here are industrially and economically advantageous in connection with each other and with related solutions, in particular e.g. the mixture of SM/ME PMD 3D image sensors and CMOS 2D image sensors and the optical, pixel-synchronous combination via a partial reflector of a high-resolution colour camera and a 3D PMD camera with optimal spectral allocation of the modulated and unmodulated light, and the mixture of the incoherent PMD measuring process with coherent measuring processes such as e.g. Speckle interferometry and also the pixel-synchronous combination of PMD duration processes and triangulation processes for 3D image processing.

The application areas of the mix detectors described above and in particular the novel photonic mixer devices is almost unlimited. With the help of suitable peripheral components in each case, a plurality of advantageous applications can be realized, in particular in an electrooptical multiplier design as electrooptical mixer, demultiplexer, switch, lattice, phase detector and electrooptical variable attenuator pad and in particular in a correlator design as demodulator, correlator, sampler, down converter, decoder, lock-in amplifier, and in particular with a peripheral component in the form of a suitably modulated optical signal source above all as three-dimensionally measuring and digitalizing photo and video camera, as 3D nightviewer, as security light barrier or security radar with adjustable control window or control room, as optical SAR (Synthetic Aperture Radar) interferometer, in the case of the latter, compared with the known microwave SAR interferometer, modulated optical radiation being used instead of the microwave radiation and optical components being used instead of the microwave components, as local three-dimensional positioning and location system, as autopilot for vehicles of all types, where an inertial system must continuously secure the universal coordinate reference of the 3D images, furthermore as outdoor and indoor 3D security sensor system in particular for vehicles, furthermore as electronic 3D robot eye, furthermore in a demultiplexer design as signal splitter and demultiplexer and in a differential multiplier design as variable attenuator pad, electrooptical switch, logical electrooptical lattice, as channel-selective receiving element according to the principles of space-division multiplex, code-division multiplex, time-division multiplex and frequency-division multiplex in the optical transmission of information, as optical bus system and as electrooptical switching system e.g. with a multi-channel space and code-division multiplex signal of an LED or laser diode array compared with a reciprocally optically fully connected PMD array with optional PMD-pixel decoding (FIG. 13), as "spatial light modulator and detector", as CDMA (Code Division Multiple Access) receiver (FIG. 13), as one or more logical receiving elements operated in the multiplex process in the optical interface of a "chip card" and in highly parallel optical interfaces of "optical computers".

The semiconductor photodiode structures according to the invention described above with ME/SM and MSM and APD structures with optionally allocated modulation electrodes ME structures have in particular the advantages listed hereafter compared with the state of the art.

1. The optical attenuation of the light signal by the modulating photogate of the known PMD structures is dispensed with completely. The modulation electrodes at the same time form the required light protection for the readout electrodes and can, as metal electrodes, transfer the highest modulation frequencies.

2. The semiconductor structure is essentially simplified and requires fewer process steps for production.

3. As between the electrodes modulated in opposite directions (e.g. $A_1$, $A_2$ and $ME_1$, $ME_2$) no further structures are required, the electrode gaps and thus the photocharge durations are decisively reduced.

4. The modulation field takes effect directly in the direction of the desired photocharge transport. This results in more effective use of the modulation voltage with the effect of increasing the drift speed and correspondingly higher modulation bandwidth, or with the possibility of essentially reducing the modulation performance.

5. As a result of the common substrate-earth contact with optimally adjustable blocking voltage, the charge carriers not participating in the mixing process are resorbed without influencing the bandwidth, or they are incorporated into the mixing process.

6. The blocking voltage of the photodiodes essentially supports the charge transport for greater penetration depths of the light signal, as it is adjustable until the saturation field strength is reached, and up to the required expansion of the space charge zone, and so essentially accelerates the charge transport from the depth of the photosensitive semiconductor material. This means that bandwidths can be achieved, which correspond to those of usual PIN photodiodes. In this way the SM/ME-PMD according to the invention is also suitable for long absorption lengths.

7. The photodiode structure of the SM-PMD is particularly advantageous for small penetration depths/absorption lengths of the light signal. In the case of absorption lengths in the 1–10 $\mu$m range and in the case of a strip structure with e.g. a lattice constant of 5–20 $\mu$m and electrode widths of 1–5 $\mu$m, modulation bandwidths of several GHz are expected.

8. The planar strip structure, in various technologies and semiconductor materials, can be flexibly adjusted to the PMD requirements laid down, via the strip width and respective finger length almost independently of the pixel size.

9. For the spectral range of approx. 4 ... 7 $\mu$m and 8 ... 12 $\mu$m e.g. with relatively high quantum yield and sufficient rapidity of approx. 100 MHz, an SM/ME-PMD cooled according to the invention in InSb (indium-antimonide) and in HgCdTe technology, and thus a 3D camera for the highest frequencies which is correspondingly optically safe, can be realized, which partially penetrates mist.

10. The SM/ME-PMD structure described is advantageously suitable for a version with load carrier multiplication (avalanche effect) due to an intense-field zone.

11. The outlay on spectral signal separation of modulation signal and photocurrent signal or electric light signal with the help of the coupling networks and readout networks must be carried out in each case only once per anode or cathode group of an SM/ME PMD pixel, and can preferably be composed of the wire capacitance of a strip wire formed from the metallization of the anodes or cathodes ($A_1$, $A_2$ or $K_1$, $K_2$) and the modulation supply wire.

12. Compared with the duration detectors in commercial equipment customary today, e.g. in distance measuring equipment DME and laser scanners LMS of Sick AG in 79177 Waldkirch, with broadband detection, broadband amplification and subsequent electronic mixing, the PMD according to the invention has a further speed advantage: The idle durations of photocharge carriers only partially penetrate the modulation bandwidth, and the RC time constant with the additional coupling capacitance of the modulation network does not penetrate it, as the mixing process is already completed when the photocurrents are read out.

13. The described double ME/SMPDM in FIG. 7 as a result of the opposite anodes and cathodes, has the structure of at least two and preferably a plurality of PIN diodes, arranged in parallel, which can preferably be operated in three different ways (the modulation electrodes are not shown in FIG. 7):

a) The opposite PMDs are independent, i.e. modulated with two different, preferably push-pull modulation signals, as a result of which the PIN-PMD carries out a double PMD function, i.e. a double push-pull mix. The two mixing processes do not influence each other if both push-pull modulation signals are orthogonal. They also do not influence each other, in the absence of signal orthogonality, if the arrangement of the opposite electrodes is orthogonal, as shown in the embodiment (14) in FIG. 7. In this case, a spectral separation of different irradiated light signals can be achieved according to the invention in that, on the side facing the light, the e.g. mainly blue light signal with typically low absorption length close to the surface generates the "blue" photocharge, whilst e.g. the mainly red light signal with typically longer absorption length penetrates deeper and, preferably supported by a reflection layer, generates the "red" photocharge, mainly on the side of the semiconductor structure facing away from the light. The double-sided planar structure can also be advantageously used for two-sided insertion of light signals.

In further designs, the present invention is developed as optoelectronically integrated PMD circuit (OEIC), in particular as digital and analog phase locked loops (PMD-PLL FIG. 12) and their use in the free and guided optical communication, communication engineering, signal processing and metrology.

The SM/ME or MSM-PMD switch with DC readout and capacitive modulation insertion can serve as sampler for depth images: The light source $P_{opt}(t)$ and the modulation source—here sampling source $u_m(t-T_D)$ is of approximately the same spike pulse form. Only with the same echo propagation time $T_{echo}=T_D$ does the depth image sampler see illuminated objects. Thus their duration or distance is established in each case. By continuously changing the delay time $T_D$, the entire depth image is scanned in depth with all pixels illuminated in parallel. The sensitivity can be determined by the scan speed. If the same depth is scanned continuously, the photocurrent can be integrated per pixel for a corresponding length of time. The SM-Schottky-PMD array could be operated similar to a sampling oscilloscope with up to millions of optical samplers instead of with 1–2 channels or electric samplers. Today, scanning times of approx. 5 ps are achieved electrically with Schottky diodes. Virtually the same range could be achieved optically, i.e. over 50 GHz bandwidth.

The same samplers can generate harmonic waves as harmonic mixers, as in the network analyzer, which downmix the $\mu W$ signals from the same frequency range of over 50 GHz and allow phase and amplitude to be measured.

In a further version of the invention, the SM-PMD, in particular as Schottky-SM-PMD, can be designed as quasi-optical, preferably binary switch element, e.g. in switching technology, which is to be asynchronously modulated for this purpose by the switching information into local fiber-optic networks, in particular on CDMA (Code Division Multiple Access) basis, in "intelligent optical light barriers" and also generally in all electrooptical digital and analog phase locked loops (PLL, in particular for simplified timing recovery) and decoding, essentially extended, microoptical PLL according to the invention and microoptical decoders for optical message signals being advantageously integratable as OEIC (optoelectronically integrated circuit).

FIG. 1 illustrates the basic principle of the direct push-pull mixing of the signal wave or the particles derived from the signal wave in the converter (UMW) on at least two outputs with the associated readout and evaluation of the differentials, sums and quantities for 3D image evaluation.

Figure 7:
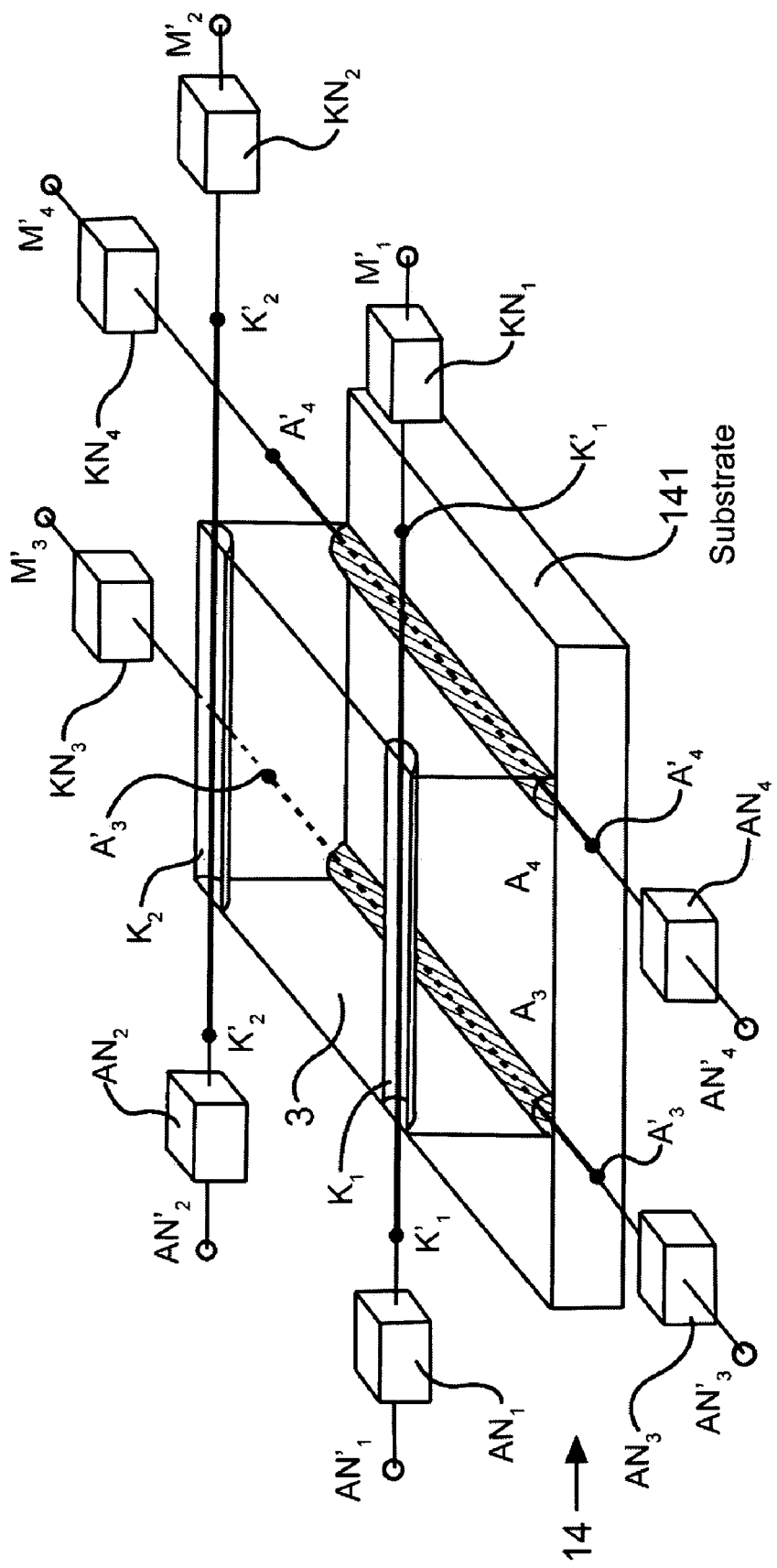
FIG. 7 illustrates a two-sided orthogonal strip structure for 4-phase PMD operation (modulation electrodes ME1 to ME4 not shown).
Figure 8:
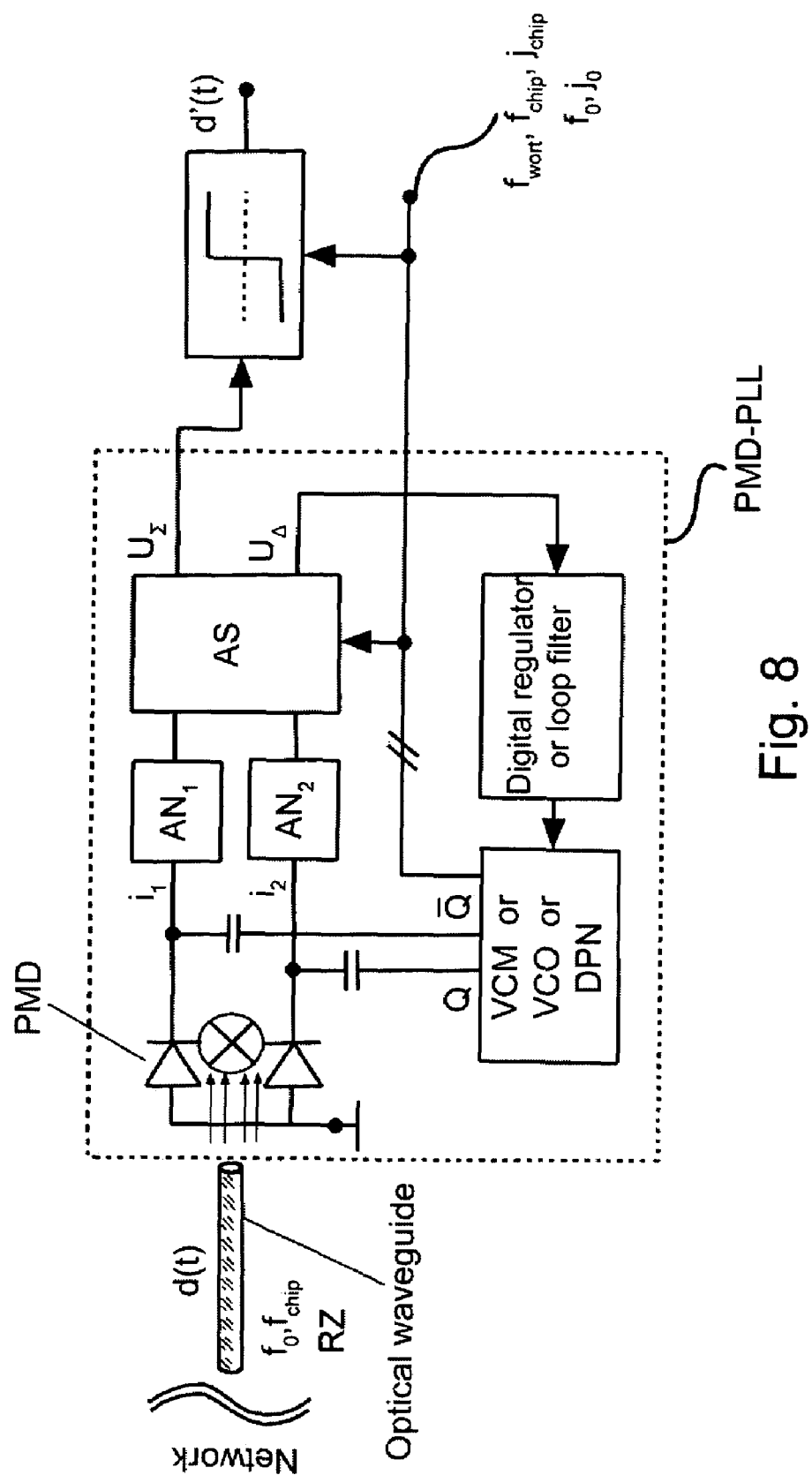
FIG. 8 illustrates a photonic mixer device phase locked loop (PLL) in particular with CDMA timing recovery.
Figure 9:
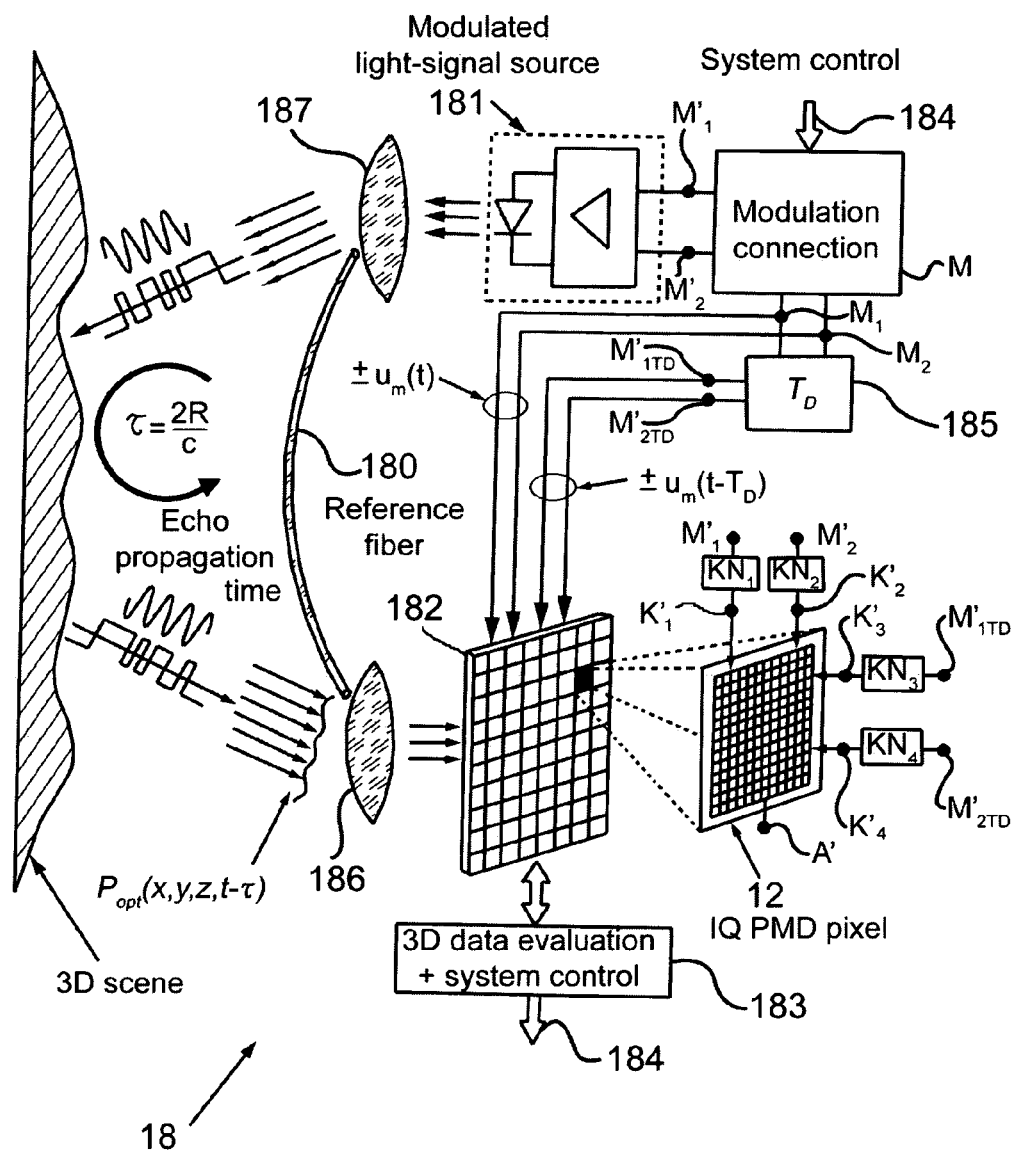
FIG. 9 illustrates a 3D camera on PMD basis with active modulated light signal source and optical reference.
Figure 11:
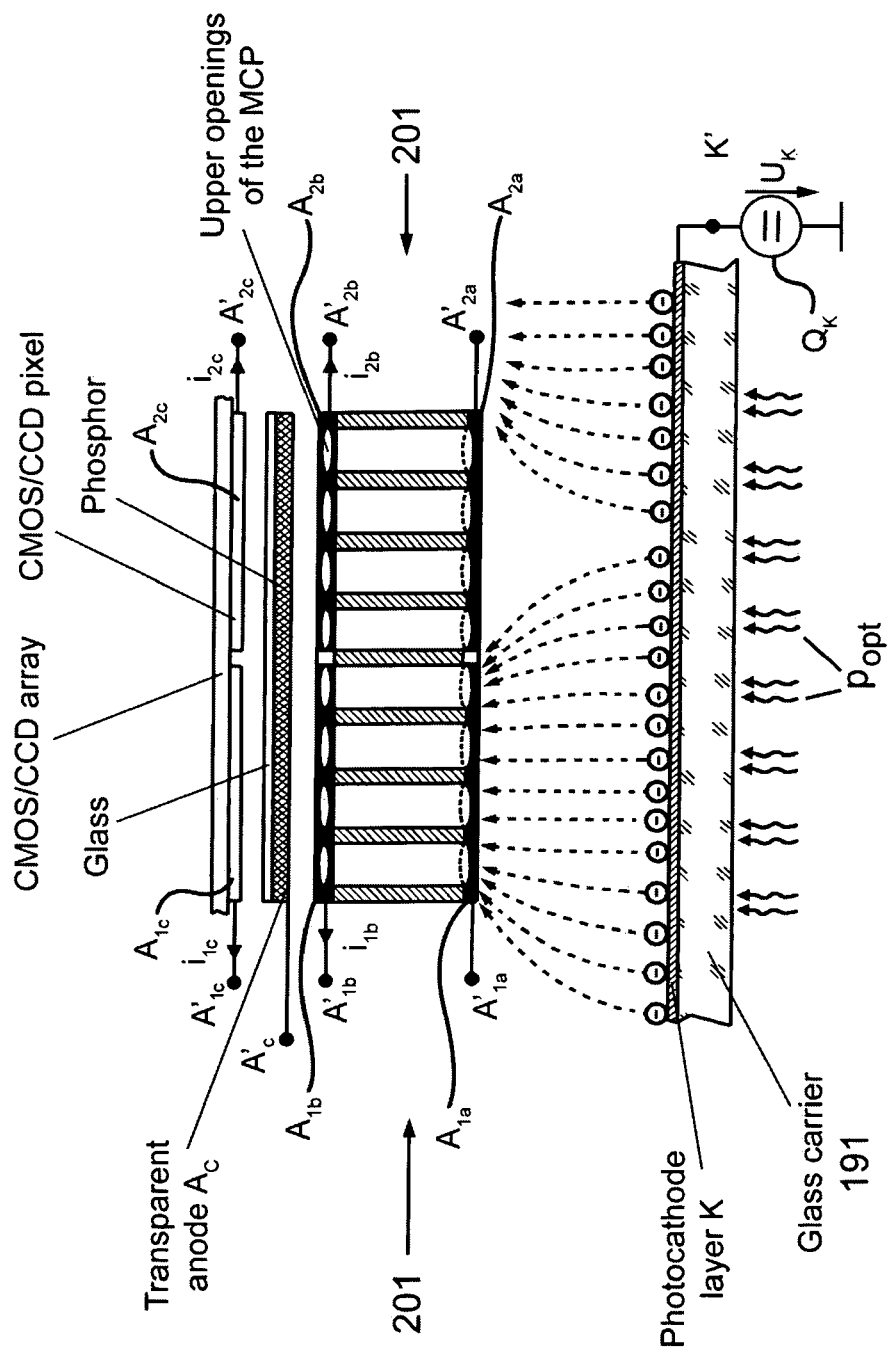
FIG. 11 illustrates an MCP-PMF, a vacuum PMD with downstream micro-channel plate amplification.
Figure 12:
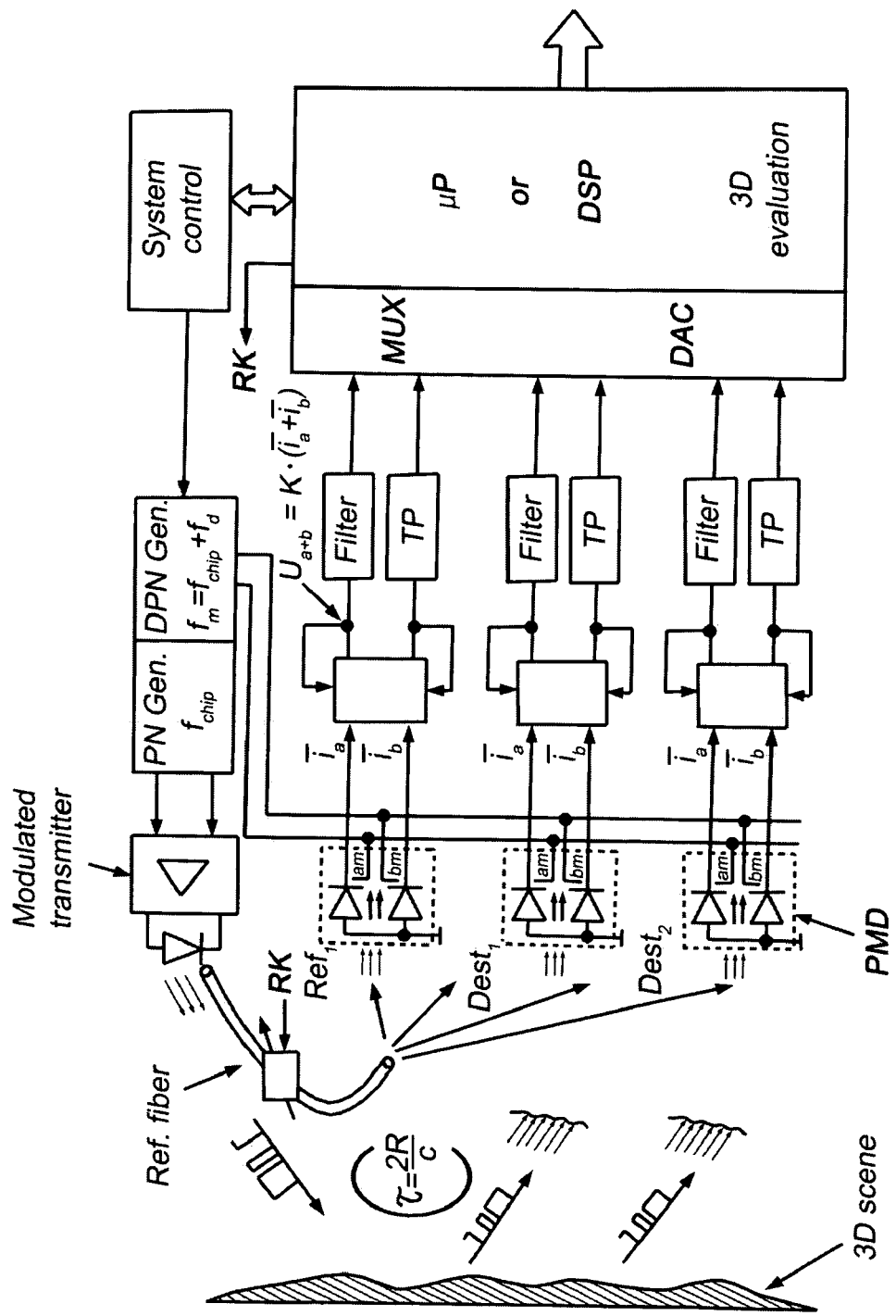
FIG. 12 illustrates the block diagram of an SM-PMD camera with PN modulation of the signal wave and DPN demodulation via in each case modulation electrodes MEa and MEb, here called am and bm, with slightly different modulation frequencies and also with common referencing of all target pixels through a reference signal.
Figure 13:
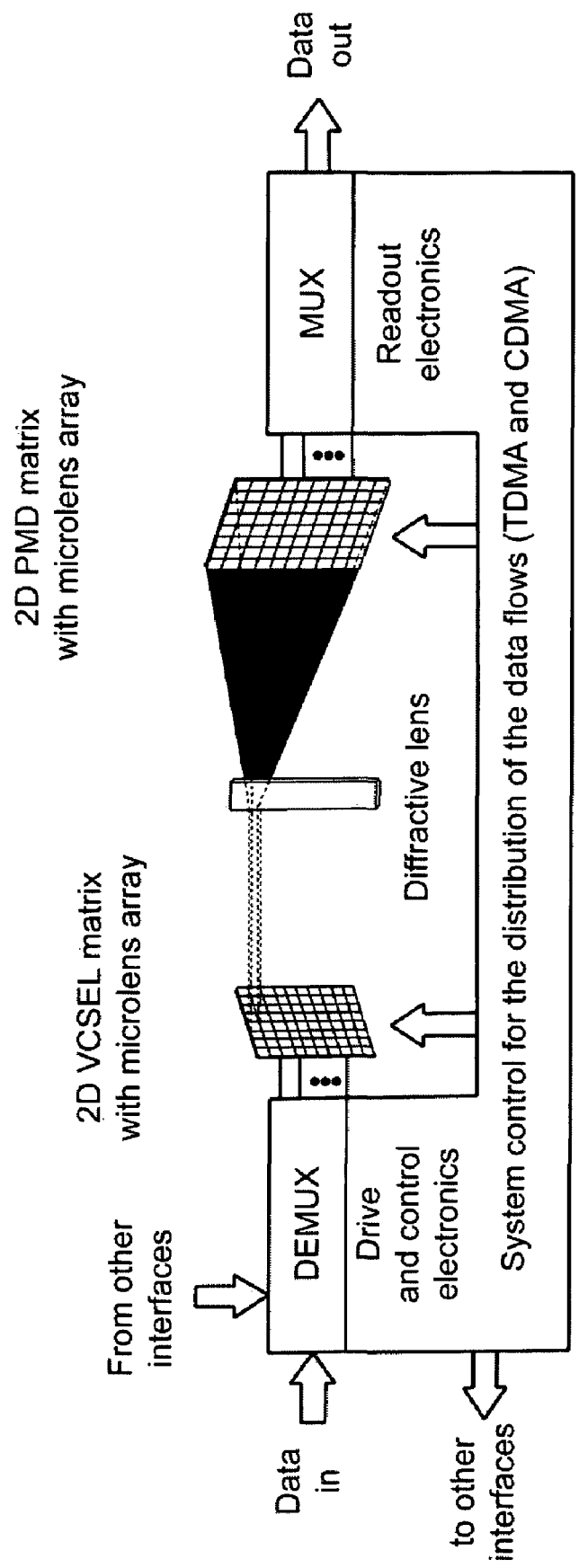
FIG. 13 illustrates a block diagram of an optical interface for switching, routing etc. with a laser diode array as transmitter and an allocated PMD array as CDMA receiver.

FIG. 2 illustrates a section through a part of a planar photonic mixer device according to the invention with cathode readout of the photoelectrons, with modulation electrodes ME as shield for the readout diodes, with a 2-phase mix (0, 90° or I/Q) and with general minimum wiring, FIG. 3 illustrates a section through a part of a planar photonic mixer device according to the invention according to FIG. 2 with an exemplary version of the readout circuit and an additional regulated compensation of uncorrelated symmetrical photocurrents, FIG. 4 illustrates a section through a part of a planar photonic mixer device according to the invention in Schottky-diode technology with anode modulation and readout and with an advantageous circuit for operating as correlator etc., FIG. 4a illustrates the replacement image of the MSM Schottky diode structure with respect to the terminals A1' and A2', FIG. 5 illustrates the top view of the photonic mixer device according to FIG. 4 including an advantageous wiring for preferably correlator applications, FIG. 6 illustrates a planar avalanche photonic mixer device, shown in cross-section of strip-form or hemispherical readout diodes with avalanche-effect intense-field zone, FIG. 7 illustrates a two-sided orthogonal strip structure for 4-phase PMD operation (modulation electrodes ME1 to ME4 not shown), FIG. 8 illustrates a photonic mixer device phase locked loop (PLL) in particular with CDMA timing recovery, FIG. 9 illustrates a 3D camera on PMD basis with active modulated light signal source and optical reference, FIG. 10 illustrates a vacuum-PMD, lattice-like additional modulation electrodes ME are not shown, FIG. 11 illustrates an MCP-PMF, a vacuum PMD with downstream micro-channel plate amplification, FIG. 12 illustrates the block diagram of an SM-PMD camera with PN modulation of the signal wave and DPN demodulation via in each case modulation electrodes MEa and MEb, here called am and bm, with slightly different modulation frequencies and also with common referencing of all target pixels through a reference signal, FIG. 13 illustrates a block diagram of an optical interface for switching, routing etc. with a laser diode array as transmitter and an allocated PMD array as CDMA receiver.

What is claimed is:

1. A Method of detecting and processing the amplitude and phase of signal waves, the method comprising:

providing a modulated signal source SQ generating signal waves, which are modified on their path by a transmission medium or object or by reflection and scattering on at least one object;

receiving by a receiving apparatus EM and there demodulating the received signal wave with a modulation signal 15, which is related to the modulation of the signal wave;

measuring and evaluating with respect to the amplitude of the modulated signal wave and the phase relationship of the modulation phase of the signal wave and of the modulation signal 15, in which the incident signal wave is demodulated directly by a suitable mixing device (MIX), this mixing device distributing the signal wave energy or particles directly representing said wave energy particles, due to a conversion by an upstream converter (UMW), in a push-pull oscillation process with a wave energy oscillator or charge oscillator in the rhythm of and matched to a modulation signal onto at least two detection/readout outputs, as mixed products;

feeding the respective output signals to a detection and readout unit (AUSL), these at least two output signals $s_a$ and $s_b$ being evaluated and further processed in a downstream evaluation unit (AUSW) with respect to the differential and the sum of these output signals;

supplying a part of the signal source energy of the receiving apparatus directly as reference signals via a known channel;

providing read out electrodes in at least two groups and including an associated or integrated shielding; and providing the groups of read out electrodes with a push-pull modulation voltage, the shielded electrodes supporting said charge oscillating process by means of appropriate static fields.

2. A Method of detecting and processing the amplitude and phase of signal waves, the method comprising:

providing a modulated signal source SQ generating signal waves, which are modified on their path by a transmission medium or object or by reflection and scattering on at least one object;

receiving by a receiving apparatus EM and there demodulating the received signal wave with a modulation signal 15, which is related to the modulation of the signal wave;

measuring and evaluating with respect to the amplitude of the modulated signal wave and the phase relationship of the modulation phase of the signal wave and of the modulation signal 15, in which the incident signal wave is demodulated directly by a suitable mixing device (MIX), this mixing device distributing the signal wave energy or particles directly representing said wave energy particles, due to a conversion by an upstream converter (UMW), in a push-pull oscillation process with a wave energy oscillator or charge oscillator in the rhythm of and matched to a modulation signal onto at least two detection/readout outputs, as mixed products;

feeding the respective output signals to a detection and readout unit (AUSL), these at least two output signals $s_a$ and $s_b$ being evaluated and further processed in a downstream evaluation unit (AUSW) with respect to the differential and the sum of these output signals;

supplying a part of the signal source energy of the receiving apparatus directly as reference signals via a known channel;

providing read out electrodes and associated integrated shielding electrodes, both in at least two groups; and providing said groups of shielding electrodes with a push-pull modulation voltage, wherein said read out electrodes support said charge oscillating process by means of appropriate static fields.

3. A Method of detecting and processing the amplitude and phase of signal waves, the method comprising:

providing a modulated signal source SQ generating signal waves, which are modified on their path by a transmission medium or object or by reflection and scattering on at least one object;

receiving by a receiving apparatus EM and there demodulating the received signal wave with a modulation signal 15, which is related to the modulation of the signal wave;

measuring and evaluating with respect to the amplitude of the modulated signal wave and the phase relationship of the modulation phase of the signal wave and of the modulation signal 15, in which the incident signal wave is demodulated directly by a suitable mixing device (MIX), this mixing device distributing the signal wave energy or particles directly representing said wave energy particles, due to a conversion by an upstream converter (UMW), in a push-pull oscillation process with a wave energy oscillator or charge oscillator in the rhythm of and matched to a modulation signal onto at least two detection/readout outputs, as mixed products;

feeding the respective output signals to a detection and readout unit (AUSL), these at least two output signals $s_a$ and $s_b$ being evaluated and further processed in a downstream evaluation unit (AUSW) with respect to the differential and the sum of these output signals;

supplying a part of the signal source energy of the receiving apparatus directly as reference signals via a known channel;

providing read out electrodes and associated shielding electrodes both in at least two groups; and providing both said at least two groups of read out electrodes and said at least two groups of associated shielding electrodes with matched push-pull modulation voltages.

4. A Method of detecting and processing the amplitude and phase of signal waves, the method comprising:

providing a modulated signal source SQ generating signal waves, which are modified on their path by a transmission medium or object or by reflection and scattering on at least one object;

receiving by a receiving apparatus EM and there demodulating the received signal wave with a modulation signal 15, which is related to the modulation of the signal wave;

measuring and evaluating with respect to the amplitude of the modulated signal wave and the phase relationship of the modulation phase of the signal wave and of the modulation signal 15, in which the incident signal wave is demodulated directly by a suitable mixing device (MIX), this mixing device distributing the signal wave energy or particles directly representing said wave energy particles, due to a conversion by an upstream converter (UMW), in a push-pull oscillation process with a wave energy oscillator or charge oscillator in the rhythm of and matched to a modulation signal onto at least two detection/readout outputs, as mixed products;

feeding the respective output signals to a detection and readout unit (AUSL), these at least two output signals $s_a$ and $s_b$ being evaluated and further processed in a downstream evaluation unit (AUSW) with respect to the differential and the sum of these output signals;

supplying a part of the signal source energy of the receiving apparatus directly as reference signals via a known channel; and providing read out electrodes in at least two groups of metallic stripes including an associated shielding and arranged in a MSM-(metal-semiconductor-metal)-structure according to Schottky technology, wherein said metallic stripes on either n-doped or p-doped semiconductor material provide Schottky-transitions.

5. Method according to any one of claims 1 to 4, wherein the different properties of the output signals of the push-pull oscillation process in the mixing device MIX are used odd for correlated signal waves $s_a$ and $s_b$, and even for non-correlated signal waves $s_a$ and $s_b$, to separate an interfering non-correlated background radiation.

6. Method according to any one of claims 1 to 4, wherein selection of the mixed product to be used is carried out through the constant or variable or adaptive adjustment, matched to the light signal, of the same spectral transmission ranges of the readout networks.

7. Method according to any one of claims 1 to 4, wherein the modulation signals and the readout signals corresponding to the photocurrent are separated due to the spectral range of the modulation signals being located sufficiently far from that of the desired mixed product, and that the transmission range of the readout networks is matched to the desired mixed product of light signal and modulation signal.

8. Method according to any one of claims 1 to 4, wherein the specific property of the photonic mixer device, in particular as correlator or as electrooptical switch can be adjusted by corresponding design of the combination of readout network and coupling network.

9. Method according to any one of claims 1 to 4, wherein the photocurrents ($i_1$, $i_2$) or the corresponding photocharges $q_1=i_1T$ and $q_2=i_2T$ are passed to at least one processing unit via the readout networks $AN_1$ and $AN_2$ in which the associated voltages $u_1$ and $u_2$ and in particular the differential voltage $u_\Delta=u_1-u_2$ and the summation voltage $u_\Sigma=u_1+u_2$ is established and transmitted as base band mixed products fed to relatively broadband readout networks and processing units matched to the bandwidth of the light signal.

10. Method according to any one of claims 1 to 4, wherein the differential voltage $u_\Delta$ can be adjusted for modulated and for unmodulated light signals by varying the amplitude $u_m$ from $-u_m$ to $+u_m$ of the push-pull modulation voltage between $-100\%$ and $+100\%$ of the modulation characteristic for $u_\Delta$.

11. Device for detecting and processing the amplitude and phase of signal waves comprising:
  a modulated signal source SQ for generating signal waves, which are modified on their path by a transmission medium or object or by reflection and scattering on at least one object;
  a receiving apparatus EM including a demodulation unit and a measuring and evaluation unit;
  a mixing device;
  an upstream converter (UMW);
  a wave energy oscillator or charge oscillator;
  at least two detection/readout outputs;
  a detection and readout unit (AUSL);
  a downstream evaluation unit (AUSW); and
  read out electrodes are provided in at least two groups and including an associated or integrated shielding;
  said receiving apparatus EM receiving said modified signals, said demodulation unit being supplied with a modulation signal, said modulation signal being related to the modulation of the signal wave, and said measuring and evaluation unit measuring and evaluating the amplitude of the modulated signal wave and the phase relationship of the modulation phase of the signal wave and of the modulation signal 15, the incident signal wave being demodulated directly by said mixing device (MIX), said mixing device distributing the signal wave energy or particles directly representing said wave energy particles, using said upstream converter (UMW), in a push-pull oscillation process with said wave energy oscillator or charge oscillator in the rhythm of and matched to a modulation signal onto said at least two detection/readout outputs as mixed products, and feeding the respective output signals to said detection and readout unit (AUSL), said output signals $s_a$ and $s_b$ being evaluated and further processed in said downstream evaluation unit (AUSW) with respect to the differential and the sum of these output signals, a part of the signal source energy of the receiving apparatus being supplied directly as reference signals via a known channel, wherein said groups of read out electrodes are connected to a push-pull modulation voltage, and said shielded electrodes are arranged for being supplied with appropriate static fields for supporting a charge oscillating process.

12. Device according to claim 11, wherein at least one SM-PMD with cathode modulation and readout (1) or with anode modulation and readout (2, 4, 19) in connection with a second electric interconnection of peripheral components representing one or more electrooptical switches, signal splitters, demultiplexers, multipliers, or logical electrooptical lattices, which forms the incident light signal can optionally be switched via the two modulation voltages $u_{m1}(t)$ and $u_{m2}(t)$ to one of said at least two readout electrodes.

13. Device according to claim 11, wherein the features, required in each case for the mixing process, of the self-mixing photonic mixer device with cathode modulation and readout, of the self-mixing photonic mixer device with anode modulation and readout, are combined in a double-mixing photonic mixer device (14).

14. Device according to claim 11, wherein one transmitting/receiving station in an optical communication network on conductor basis or in free space contains one or more PMD pixels with preferably varying modulation, one or more light signals, which correspond, because of varying modulation e.g. in the frequency, code and time-division multiplex, to one or more communication channels, each being selected and received according to a selectable PMD modulation, the one or more PMD pixels preferably being incorporated in integrated manner into an analog or digital phase locked loop preferably in the same semiconductor circuit.

15. Device according to claim 11, wherein the light signal is inserted into one or more photonic mixer devices via one or more semiconductor optical waveguides.

* * * * *